United States Patent
Branagan et al.

(10) Patent No.: US 7,341,765 B2
(45) Date of Patent: *Mar. 11, 2008

(54) METALLIC COATINGS ON SILICON SUBSTRATES, AND METHODS OF FORMING METALLIC COATINGS ON SILICON SUBSTRATES

(75) Inventors: Daniel J. Branagan, Idaho Falls, ID (US); Timothy A. Hyde, Idaho Falls, ID (US); James R. Fincke, Los Alamos, NM (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 399 days.

This patent is subject to a terminal disclaimer.

(21) Appl. No.: 10/918,287

(22) Filed: Aug. 13, 2004

(65) Prior Publication Data

US 2005/0164016 A1 Jul. 28, 2005

Related U.S. Application Data

(63) Continuation-in-part of application No. 10/766,713, filed on Jan. 27, 2004, now abandoned.

(51) Int. Cl.
*B05D 5/00* (2006.01)
*B05D 3/02* (2006.01)
*B05D 3/06* (2006.01)
*C23C 14/14* (2006.01)
*C23C 14/28* (2006.01)
*C23C 14/58* (2006.01)

(52) U.S. Cl. .................. 427/597; 427/561; 427/250; 427/383.3; 427/383.5

(58) Field of Classification Search .................... None
See application file for complete search history.

(56) References Cited

U.S. PATENT DOCUMENTS 3,986,867 A 10/1976 Masumoto et al.

(Continued)

FOREIGN PATENT DOCUMENTS

JP 57-185927 * 11/1982 .................. 427/597

(Continued)

OTHER PUBLICATIONS

W. T. Kwon et al., "Effect of group IV elements on the cutting characteristics of Ti(C,N) cermet tools and reliability analysis", J. Mat. Processing Tech., vol. 166, #1, Jul. 15, 2005, pp. 9-14.*

(Continued)

*Primary Examiner*—Marianne Padgett
(74) *Attorney, Agent, or Firm*—Wells St. John (57) ABSTRACT

The invention includes methods of forming a metallic coating on a substrate which contains silicon. A metallic glass layer is formed over a silicon surface of the substrate. The invention includes methods of protecting a silicon substrate. The substrate is provided within a deposition chamber along with a deposition target. Material from the deposition target is deposited over at least a portion of the silicon substrate to form a protective layer or structure which contains metallic glass. The metallic glass comprises iron and one or more of B, Si, P and C. The invention includes structures which have a substrate containing silicon and a metallic layer over the substrate. The metallic layer contains less than or equal to about 2 weight % carbon and has a hardness of at least 9.2 GPa. The metallic layer can have an amorphous microstructure or can be devitrified to have a nanocrystalline microstructure.

16 Claims, 4 Drawing Sheets

U.S. PATENT DOCUMENTS

| | | | |
|---|---|---|---|
| 3,989,517 A | 11/1976 | Tanner et al. | |
| 4,144,058 A | 3/1979 | Chen et al. | |
| 4,290,808 A | 9/1981 | Ray | |
| 4,372,989 A * | 2/1983 | Menzel | 427/555 |
| 4,386,896 A | 6/1983 | Ray | |
| 4,398,342 A | 8/1983 | Pitt et al. | |
| 4,523,621 A | 6/1985 | Ray | |
| 4,576,653 A | 3/1986 | Ray | |
| 4,581,081 A | 4/1986 | Kroeger et al. | |
| 4,631,617 A * | 12/1986 | Tanaka et al. | 360/131 |
| 4,634,306 A * | 1/1987 | Dzuik | 401/215 |
| 4,639,543 A | 1/1987 | Fang | |
| 4,677,036 A * | 6/1987 | Nakamura et al. | 428/815 |
| 4,725,512 A | 2/1988 | Scruggs | |
| 4,820,141 A | 4/1989 | Shingu et al. | |
| RE32,925 E | 5/1989 | Chen et al. | |
| 4,964,967 A * | 10/1990 | Hashimoto et al. | 204/292 |
| 5,130,103 A * | 7/1992 | Yamagata et al. | 428/209 |
| 5,203,929 A * | 4/1993 | Takayanagi et al. | 148/121 |
| 5,527,401 A * | 6/1996 | Kim | 148/648 |
| 5,589,011 A | 12/1996 | Gonsalves | |
| 5,643,531 A | 7/1997 | Kim et al. | |
| 6,083,570 A * | 7/2000 | Lemelson et al. | 427/554 |
| 6,258,185 B1 | 7/2001 | Branagan et al. | |
| 6,261,389 B1 | 7/2001 | Perepezko et al. | |
| 6,270,591 B2 | 8/2001 | Chriac et al. | |
| 6,387,530 B1 * | 5/2002 | Liu et al. | 428/559 |
| 6,689,234 B2 * | 2/2004 | Branagan | 148/660 |
| 6,767,419 B1 * | 7/2004 | Branagan | 148/522 |
| 6,773,817 B1 * | 8/2004 | Sagel et al. | 428/457 |
| 7,067,022 B2 * | 6/2006 | Branagan | 148/525 |
| 2002/0072191 A1 | 6/2002 | Aoki et al. | |
| 2003/0114698 A1 * | 6/2003 | Keller et al. | 556/136 |
| 2004/0157066 A1 * | 8/2004 | Arzoumanidis | 428/472 |
| 2006/0049478 A1 * | 3/2006 | Yamada et al. | 257/458 |

FOREIGN PATENT DOCUMENTS

| | | | | |
|---|---|---|---|---|
| JP | 58-3979 | * | 1/1983 | 427/554 |
| JP | 61-170546 | * | 8/1986 | 148/525 |
| JP | 61-186415 | * | 8/1986 | |
| JP | 1-259181 | * | 10/1989 | 427/586 |
| JP | 1-275717 | | 11/1989 | |
| JP | 1-290753 | * | 11/1989 | 427/597 |
| JP | 2004-265889 | * | 9/2004 | |
| WO | WO 2004/064166 A1 | * | 7/2004 | |

OTHER PUBLICATIONS

J.V. Armstrong, et al.: "Enhanced Corrosion Resistance in $Nd_{15}Fe_{77}B_8$ by Laser Surface Amorphization"; Hyperfine Interactions vol. 46, 1989; pp. 467-471, no month.

W. L. Johnson: "Metallic Glasses"; Keck Laboratory of Engineering, California Institute of Technology; pp. 804-821, no date, source unclear, might be a publication (? book) called *Special-Purpose Materials*, some parts very hard to read due to highlighting & copying.

A. Peker et al.; "Time-temperature-transformation diagram of a highly processable metallic glass"; Materials Science and Engineering A179/A180, 1994; pp. 173-175, no month.

* cited by examiner

METALLIC COATINGS ON SILICON SUBSTRATES, AND METHODS OF FORMING METALLIC COATINGS ON SILICON SUBSTRATES

RELATED APPLICATIONS

This application is a Continuation-in-part of U.S. patent application Ser. No. 10/766,713 filed on Jan. 27, 2004, now abandonded.

CONTRACTUAL ORIGIN OF THE INVENTION

The United States Government has rights in the following invention pursuant to Contract No. DE-AC07-99ID13727 between the U.S. Department of Energy and Bechtel BWXT Idaho, LLC.

TECHNICAL FIELD

The invention pertains to metallic coatings on silicon substrates, protected silicon surfaces, methods of forming metallic coatings on silicon substrates and methods of protecting silicon surfaces and other semiconductor surfaces.

BACKGROUND OF THE INVENTION

Silicon and materials containing silicon are used for a variety of electronic applications including semiconductors and other electronic devices, and also in technologies such as microelectromechanical systems (MEMS), and Integrated Micromechanical Systems-on-a-Chip. Due to the excellent semiconductive properties of silicon, silicon has been utilized extensively in various electronics industries. Such extensive use has lead to the development of silicon processing methods such as photolithography and other patterning techniques which allow precision processing and fabrication of microscale silicon structures. These techniques are now additionally being employed to form silicon devices such as, for example, microengines. However, silicon has relatively poor mechanical properties, and has little wear resistance and corrosion resistance relative to other materials such as some metallic materials. Technology has yet to be developed for the patterning of metal materials on the microscale size level with the precision which silicon processing occurs.

Steel is a metallic alloy which can have exceptional strength characteristics, and which is commonly utilized in structures where strength is required or advantageous, such as in the skeletal support of building structures, tools, engine components, and protective shielding. The internal structure (microstructure) of conventional steel alloys is always metallic and polycrystalline (consisting of many crystalline grains). More recently, steel alloys have been developed which can attain an amorphous microstructure, referred to as metallic glass. The metallic glass can in turn be treated to "devitrify" the glass and thereby form a crystalline structure which can, in some instances, be nanocrystalline (having crystal grains on the order of $10^{-9}$ meters).

The particular alloy composition generally determines whether the alloy will solidify to form microcrystalline grain structures or amorphous glass. Conventional steels having microcrystalline grain structure can be produced to have a high hardness, although an increased hardness can be accompanied by a decrease in toughness utilizing conventional steel processing methods. Amorphous glass steel materials can be produced which can have exceptionally high strength and hardness. Additionally, amorphous steel can be devitrified to produce materials having nanocrystalline grains, and having an increased hardness relative to the glass. Further, nanocrystalline steel materials formed by devitrification of metallic glass can be produced which can achieve an increased hardness without a corresponding loss of toughness.

The steel materials discussed above have high strength, and are highly resistant to wear and corrosion, relative to silicon materials. It is desirable to develop methods of coating silicon materials with steel materials and methods of metallizing silicon surfaces.

SUMMARY OF THE INVENTION

In one aspect, the invention encompasses a method of forming a metallic coating on a substrate which contains silicon. The substrate has a silicon surface and a metallic glass layer is formed over the silicon surface. In one aspect the invention encompasses a method of protecting a substrate which contains silicon. The substrate is provided within a deposition chamber along with a deposition target. Material from the deposition target is deposited over at least a portion of the silicon substrate to form a protective layer which contains metallic glass. The metallic glass comprises iron and one or more of B, Si, P and C.

In one aspect the invention encompasses a structure including a substrate containing silicon and a metallic layer over the substrate. The metallic layer contains less than or equal to about 2 weight % carbon and has a hardness of at least about 9.2 GPa. The metallic layer can have an amorphous microstructure or can be devitrified to have a nanocrystalline microstructure.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methodology for forming metallic glass materials and for forming materials having nanocrystalline scale composite microstructures over silicon substrates. For purposes of the present description, the term "silicon substrate" can refer to any structure or device comprising silicon. The silicon comprised by the substrate is not limited to a particular form and can comprise monocrystalline silicon, polycrystalline silicon, amorphous silicon, silicon oxide, silicon dioxide, silicon nitride, silicon carbide and combinations thereof. Additionally, the substrate can comprise any of the listed silicon materials in combination with other non-silicon materials.

Figure 1:
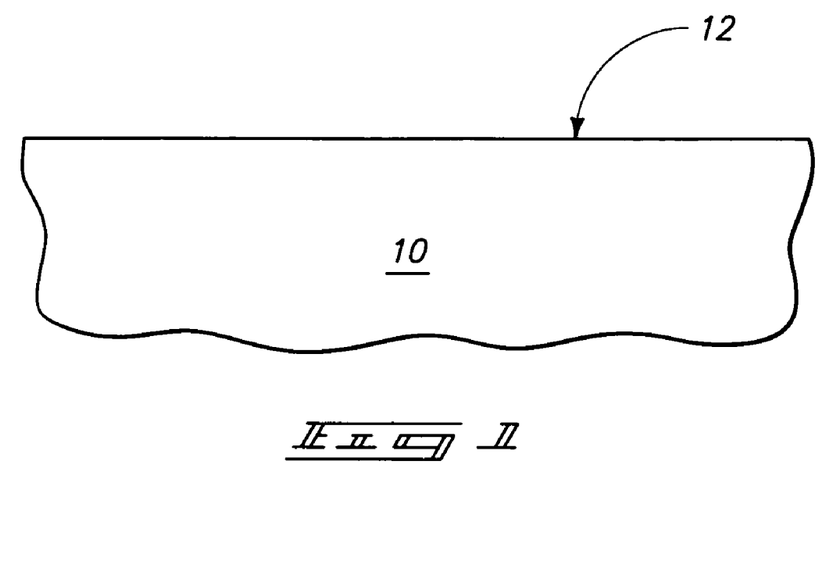
FIG. 1 is a fragmentary, diagrammatic, cross sectional view of a substrate at a preliminary processing step of a method of the present invention.
Figure 2:
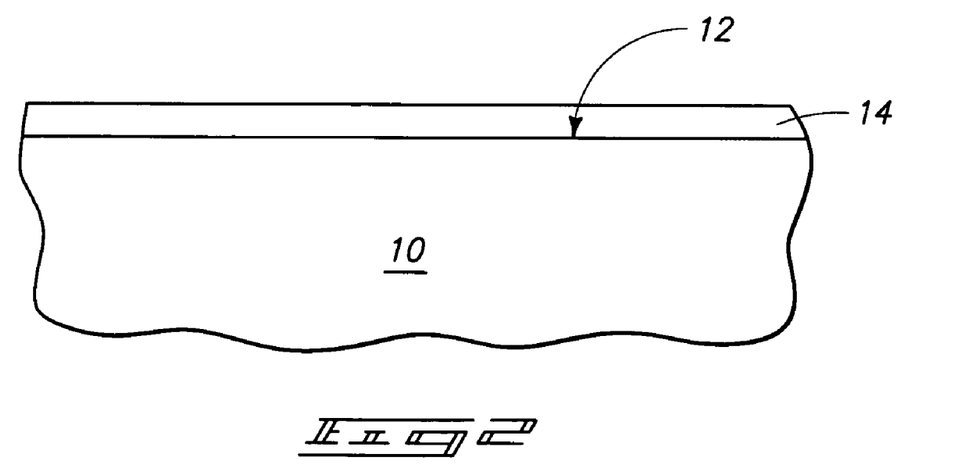
FIG. 2 is a view of the FIG. 1 substrate shown at a processing step subsequent to that of FIG. 1.

A process encompassed by the present invention is described generally with reference to FIGS. 1 and 2. Referring first to FIG. 1, a substrate 10 is provided for treatment of a surface 12. Substrate 10 comprises silicon and can further comprise additional materials as discussed above. Surface 12 can comprise a silicon surface such as, for example, a surface comprising monocrystalline silicon, polysilicon, amorphous silicon, silicon oxide, silicon dioxide, silicon nitride or silicon carbide. Alternatively, surface 12 can comprise a non-silicon material comprised by the silicon substrate such as, for example, a metallic material. Additionally, surface 12 can comprise a plurality of materials. For example, surface 12 can comprise two or more silicon comprising materials, can comprise two or more non-silicon materials or can comprise mixtures of silicon materials and non-silicon materials. Preferably, at least a portion of surface 12 comprises silicon. It can be advantageous for surface 12 to comprise at least some silicon for enhancing adhesion of a subsequently deposited metallic layer (discussed below).

Surface 12 can be planar as shown in FIG. 1, or alternatively can be non-planar or patterned (not shown). A patterned surface 12 can be provided by, for example, patterning substrate 10 utilizing conventional patterning techniques such as, for example, photolithography and/or etching techniques.

Referring to FIG. 2, surface 12 can be treated by forming a layer 14 comprising a metallic material over surface 12. Formation of layer 14 can preferably comprise deposition utilizing an ablation technique. Exemplary ablation techniques which can be utilized for purposes of deposition of layer 14 include pulsed laser deposition, sputtering and other conventional ablation techniques. The ablation deposition can utilize a single deposition target or multiple deposition targets. In particular aspects, multiple targets of differing composition can be utilized wherein the combination of differing compositions can be combined to form a desired total composition. Additionally, where a single target is utilized the single target can comprise a homogeneous ablation surface consisting of the composition to be deposited or can comprise a heterogeneous surface having regions of differing composition wherein the differing compositions can be combined to provide the desired total composition to be deposited. For purposes of the present description, the total composition to be ablated can be referred to as the source composition. Although deposited layer 14 can preferably comprise a composition identical to the source composition, it is to be understood that the deposited composition can vary somewhat relative to the source material composition.

A source material for purposes of the present invention preferably comprises a steel material composition capable of forming a metallic glass. For purposes of interpreting this disclosure and the claims that follow, "steel" is defined as any iron-based alloy in which no other single element (other than iron) is present in an excess of 30 weight %, for which the iron content amounts to at least 55 weight % and carbon is limited to a maximum of 2 weight %. Steel alloys of can additionally incorporate other elements including, but not limited to, manganese, nickel, chromium, molybdenum, vanadium, silicon, aluminum, boron, phosphorous, sulfur, tungsten, and any of the rare earth metals.

An exemplary steel composition comprises at least 55% iron, by weight, and can additionally comprise at least one of B, C, Si and P. In particular aspects of the present invention, the composition will comprise at least two of B, C, and Si. The composition can comprise each of C, B and Si and in particular embodiments can comprise B, C, and Si at an atomic ratio of $B_{17}C_5Si_1$, or at an atomic ratio of $B_{16}C_4Si_1$. In particular aspects of the invention, the composition can contain at least one transition metal, preferably selected from the group consisting of W, Mo, Cr, and Mn. Al and/or Gd can also be present in the composition in particular aspects of the invention. The particular composition of a steel alloy generally determines whether the alloy is capable of forming an amorphous glass (metallic glass) when the alloy solidifies.

Compositions of the present invention preferably comprise fewer than eleven elements, and can more preferably comprise fewer than nine elements. Additionally, the composition can comprise as few as two elements. In particular embodiments, the mixture can consist essentially of fewer than eleven elements. Where a particularly pure composition is desired, the composition can consist of fewer than eleven elements. Further, the composition can consist essentially of, or can consist of as few as two elements. Generally, the steel compositions are composed of from four to eight elements.

Exemplary steel compositions which can be utilized in the methodology of the present invention include $Fe_{63}Mo_2Si_1$, $Fe_{63}Cr_8Mo_2$, $Fe_{63}Mo_2Al_4$, $(Fe_{0.8}Cr_{0.2})_{81}B_{17}W_2$, $(Fe_{0.8}Mo_{0.2})_{83}B_{17}$, $Fe_{63}B_{17}Si_1$, $Fe_{63}Cr_8Mo_2C_5$, $Fe_{63}Mo_2C_5$, $Fe_{80}Mo_2O$, $Fe_{63}Cr_8Mo_2B_{17}$, $Fe_{83}B_{17}$, $Fe_{63}B_{17}Si_5$, $Fe_{63}B_{17}C_2$, $Fe_{63}B_{17}C_3Si_3$, $(Fe_{0.8}Cr_{0.2})_{79}B_{17}W_2C_2$, $Fe_{63}B_{17}C_3Si_5$, $Fe_{63}B_{17}C_2W_2$, $Fe_{63}B_{17}C_8$, $Fe_{63}B_{17}C_5$, $Fe_{63}B_{17}C_5Si_5$, $(Fe_{0.8}Cr_{0.2})_{78}Mo_2W_2B_{12}C_5Si_1$, $Fe_{63}B_{17}C_5W_5$, $(Fe_{0.8}Cr_{0.2})_{71}Mo_2W_2B_{17}C_5Si_1Gd_2$, $(Fe_{0.8}Cr_{0.2})_{75}Mo_2B_{17}C_5$ µl, $(Fe_{0.8}Cr_{0.2})_{76}Mo_2W_2B_{14}C_5Si_1$, $(Fe_{0.8}Cr_{0.2})_{73}Mo_2W_2B_{16}C_4Si_1Mn_2$, $Fe_{63}B_{17}C_5Si_1$, $Fe_{63}Cr_8Mo_2B_{17}C_5$, $Fe_{63}Cr_8Mo_2B_{17}C_5Si_1Al_4$, $(Fe_{0.8}Cr_{0.2})_{75}W_2B_{17}C_5Si_1$, $(Fe_{0.8}Cr_{0.2})_{73}Mo_2W_2B_{17}C_5Si_1$, $(Fe_{0.8}Cr_{0.2})_{72}Mo_2W_2B_{17}C_5Si_1Gd_1$, and $(Fe_{0.8}Cr_{0.2})_{74}Mo_2W_2B_{17}C_4Si_1$.

Figure 3:
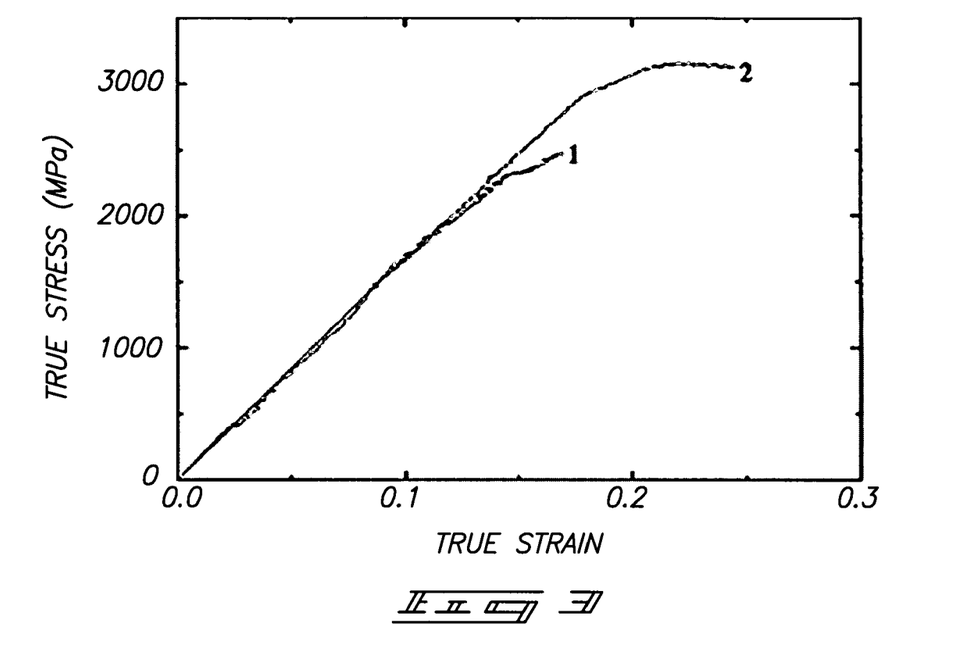
FIG. 3 illustrates true-stress/true-strain measurements obtained from metallic ribbons comprising metallic glass of the composition $(Fe_{0.8}Cr_{0.2})_{81}B_{17}W_2$. The graph curves reflect data obtained at 20° C. at a strain rate of $10^{-3}$ s$^{-1}$.

It can be advantageous to utilize the steel compositions as set forth above for forming layer 14 due to the ability of the compositions to form super-hard steel coatings. These compositions have been shown to be able of forming metallic glass structures which may be transformed through a solid-solid state devitrification transformation to yield multiphase nanoscale composite microstructures. As deposited (prior to devitrification) these compositions can comprise up to 100% amorphous structure (metallic glass) and can typically have a hardness of at least about 9.2 GPa since all properties of the metallic glass formed of the composition have been determined by forming metallic glass ribbons of the composition to be tested. As shown in FIG. 3, stress strain curves for metallic glass ribbons show that elongation as high as 60% is obtainable. Devitrification of the steel alloy compositions can further increase the hardness of the material. Additionally, devitrified ribbons have exhibited super plasticity having maximum elongation of up to about 180%. Yield strengths for the steel compositions have been measured as high as 2880 MPa with ultimate yield strengths of 3140 MPa and tensile elongation of 5% (FIG. 3) at room temperature.

Deposition targets for utilization for forming layer 14 can be prepared by depositing the desired compositions onto a base such as a 4340 base steel coupon. Such target formation can utilize thermal deposition techniques including but not limited to high velocity oxyfuel (HVOF) deposition of the composition onto the base. Alternatively, other conventional methods of target formation can be utilized.

Still referring to FIG. 2, layer 14 is not limited to any particular thickness and can preferably be performed to have a thickness of from about 10 Angstroms up to about 3 microns, more preferably from 0.5 microns to about 1.5 microns. Where pulsed laser deposition is utilized, a deposition rate can typically be about 10 Angstroms per second. It is to be understood that the methods of the present invention encompass other deposition techniques and rates, and that the preferable range of deposition rates may vary depending on the technique utilized. Accordingly, deposition time will vary based on the deposition conditions, the source composition, and the technique utilized.

The as-deposited coatings of the invention adhere well to silicon substrates when applied using ablation techniques. Although thermal deposition techniques, such as High Velocity Oxy Fuel (HVOF) deposition or plasma spray deposition, can be utilized to deposit steel coatings onto silicon substrate, the coatings formed by such thermal deposition methods adhere to silicon materials less strongly relative to those formed by ablation techniques. Steel coatings formed by ablation deposition under appropriate conditions adhere to the silicon substrate such that the coating remains adhered to the silicon surface after repeated attempts to scrape off the coating with a razor blade.

Deposition temperature during the formation of layer 14 can affect the strength of adhesion of layer 14 to the underlying substrate. Where the deposition temperature is too high the steel composition deposited can dissolve some of the silicon into the steel, and where the deposition temperature is too low, the metallic layer 14 does not adhere as well relative to utilization of a higher deposition temperature. Additionally, uniformity, roughness and topography of an outer surface of layer 14 can vary depending on deposition conditions. An appropriate deposition condition will depend upon the composition to be deposited, the composition of surface 12, and additional factors such as whether substrate 10 has been preheated prior to initiation of the deposition of layer 14.

Figure 4:
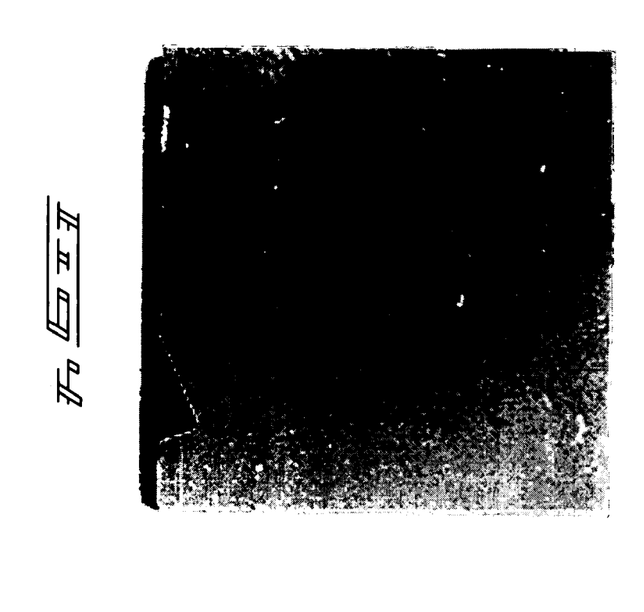
FIG. 4 is a scanned image of a coated silicon coupon which was coated by pulsed laser depositing a coating of approximately 1 micron thickness of composition $(Fe_{0.8}Cr_{0.2})_{73}Mo_2W_2B_{16}C_4Si_1Mn_2$.
Figure 5:
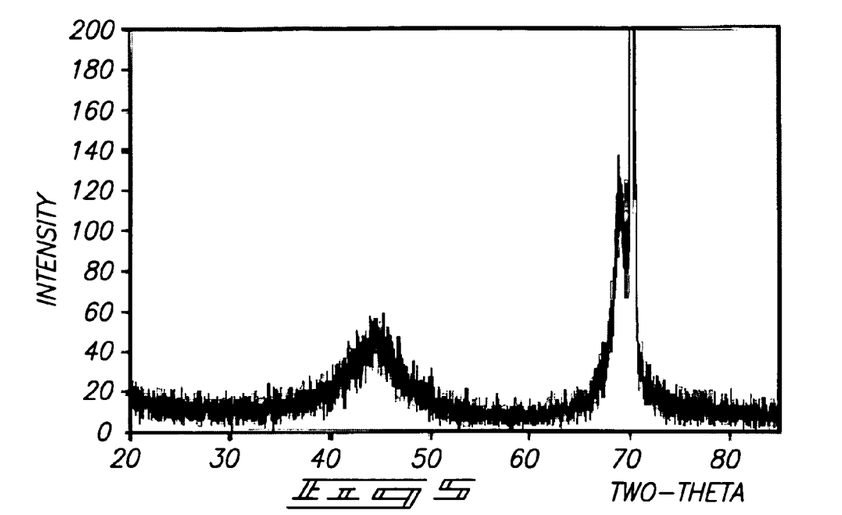
FIG. 5 shows an X-ray diffraction scan of the as-deposited coating shown in FIG. 4.
Figure 6:
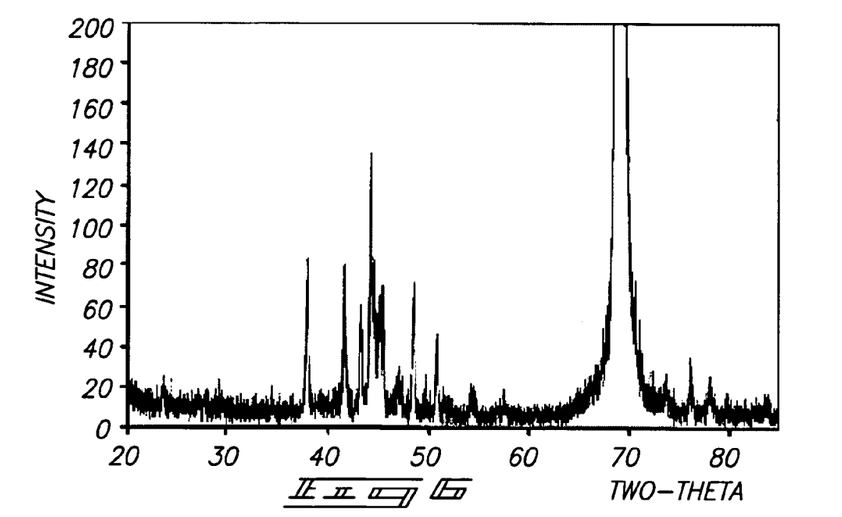
FIG. 6 shows an X-ray diffraction scan of the coated silicon coupon of FIG. 4 which has been subsequently heat treated at 700° C. for 1 hour.

FIG. 4 shows a scanned image of a surface of a silicon coupon coated with approximately 1 micron thickness of material deposited from a target having composition $(Fe_{0.8}Cr_{0.2})_{73}Mo_2W_2B_{16}C_4Si\ Mn_2$. The coating shown was deposited by pulsed laser deposition using a 200 mJ laser at 20 Hz. The scanned image was obtained from the layer as deposited (prior to any devitrification). The X-ray diffraction scan shown in FIG. 5 was performed on the as-deposited layer shown in FIG. 4. In FIG. 5, the broad peak centered near 45° indicates that an amorphous structure was formed. The single Bragg diffracted peak in FIG. 5 is due to the silicon substrate.

Prior to any subsequent treatment, as-deposited layer 14 can comprise a microstructure that includes at least some metallic glass. The amount of amorphous structure within layer 14 will depend upon the deposition method, the deposition conditions and the composition of the source material. As discussed above, layer 14 can comprise a hardness of greater than about 9.2 GPa. Typically, layer 14 will comprise a hardness of between about 9.2 GPa and about 15.0 GPa. Depending upon the desired properties for coating layer 14, substrate 10 can be utilized without further processing of layer 14. Alternatively, the metallic material of layer 14 can be further treated to devitrify some or all of the metallic glass present in the metallic material to form crystalline material having a nanocrystalline grain size. This solid-solid devitrification step can result in an increased hardness of the devitrified layer relative to the as-deposited layer.

Devitrification of the material of layer 14 can comprise heat treatment of the as-deposited layer. The treatment can comprise heating the layer, or a portion of the layer, to a temperature above the crystallization temperature of the particular deposited steel composition and less than the melting temperature of the composition, and can comprise heating from between 1 minute to about 1,000 hours. Devitrification will typically comprise heating layer 14 from about 550° C. to about 850° C. for between about 10 minutes and about 1 hour.

Heat treatment of metallic glass material enables the solid state phase change wherein the amorphous metallic glass can be converted to one or more crystalline solid phases. The solid state devitrification of amorphous glass structure enables uniform nucleation to occur throughout the amorphous material to form nanocrystalline grains within the glass. The metallic matrix microstructures formed by devitrification can comprise a steel matrix (iron with dissolved interstitials) or a complex multi-phase matrix comprising several phases, one of which is ferrite. The nanocrystalline steel metal matrix composite grain structure can enable a combination of mechanical properties which are improved compared to the properties which would exist with larger grain sizes or with the metallic glass. Such improved mechanical properties can include, for example, high strength and high hardness, and for particular compositions of the present invention can include a maintained or even increased toughness relative to materials comprising larger grain sizes or comprising metallic glass.

The resulting structure of devitrified material can comprise nanoscale grains comprising from about 50 to about 150 nanometer grain size. Additionally, the devitrified material can comprise second phase precipitates at grain boundaries having a precipitate size on the order of 20 nanometers. FIGS. 6, 7, 8 and 9 show data obtained after devitrification of the as-deposited layer (shown in FIG. 4) according to methods of the present invention. The as deposited layer was heat treated at 700° C. for one hour. The X-ray diffraction scan shown in FIG. 6 reveals many sharp crystalline peaks indicated that several nanoscale phases formed in the devitrified material.

Figure 7A:
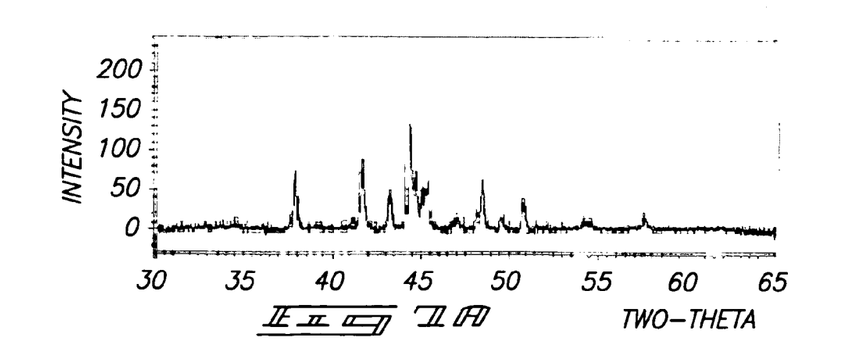
FIG. 7 illustrates measured (Panel A) and Rietveld refined (calculated, Panel B) X-ray diffraction patterns of a pulsed laser deposited coating comprising the composition $(Fe_{0.8}Cr_{0.2})_{73}Mo_2W_2B_{16}C_4Si_1Mn_2$ after heat treating the coating for 1 hour at 700° C.
Figure 7B:
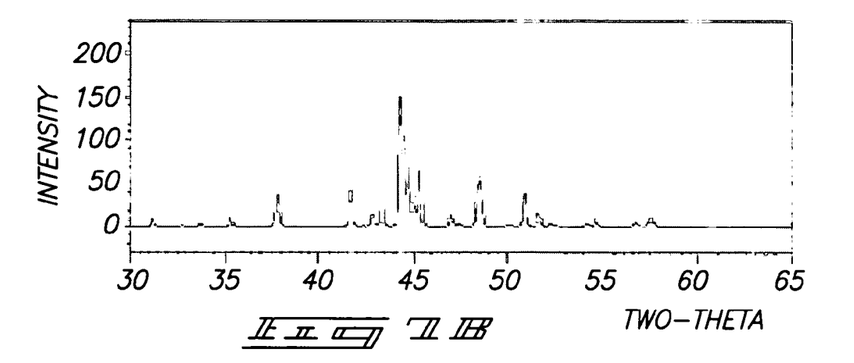

Referring to FIG. 7, an X-ray diffraction data pattern shown in Panel A was obtained from the heat treated coating and was in turn refined as shown in Panel B to identify the nanocomposite structure which is summarized in Table 1.

TABLE 1

Phase Information for a Devitrified Coating Deposited from A Target of Composition $(Fe_{0.8}Cr_{0.2})_{73}Mo_2W_2B_{16}C_4Si_1Mn_2$

| PHASE | Crystal Structure | Space Group | Lattice Parameters (Å) |
|---|---|---|---|
| α-Fe | cubic | Im3m | a = 2.867 |
| $Fe_{23}C_6$ | cubic | Fm3m | a = 10.614 |
| $Fe_3B$ | tetragonal | I-4 | a = 8.636; c = 4.267 |
| $Fe_2B$ | tetragonal | I4/mcm | a = 5.083; c = 4.222 |

The microstructure of the heat treated coating was found to consist of four phases (α-Fe, $Fe_{23}C_6$, $Fe_3B$ and $Fe_2B$). These results are similar to those obtained previously from a coating formed by HVOF. The present analysis indicated an additional phase ($Fe_2B$) in the coating formed by pulsed laser deposition relative to the HVOF coating. This additional phase is not unusual in alloys of this type and is the stable phase in the Fe—B binary system.

Figure 8:
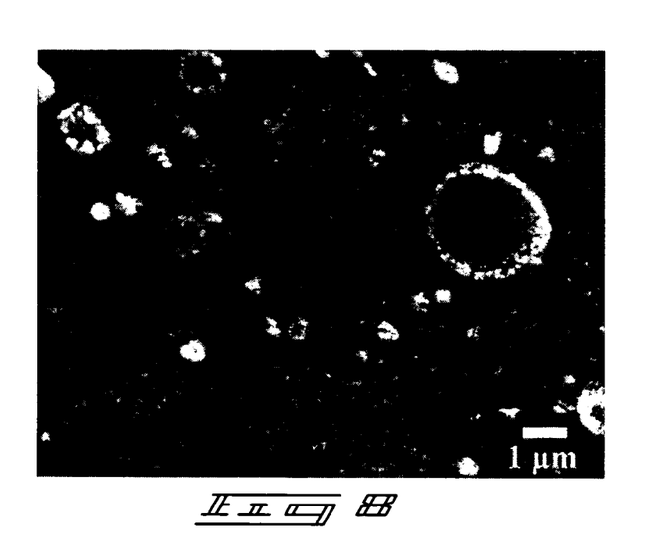
FIG. 8 is a SEM micrograph of a coating deposited from a target comprising $(Fe_{0.8}Cr_{0.2})_{73}Mo_2W_2B_{16}C_4Si_1Mn_2$, formed by methods of the present invention utilizing pulsed laser deposition followed by treatment for 1 hour at 700° C.
Figure 9:
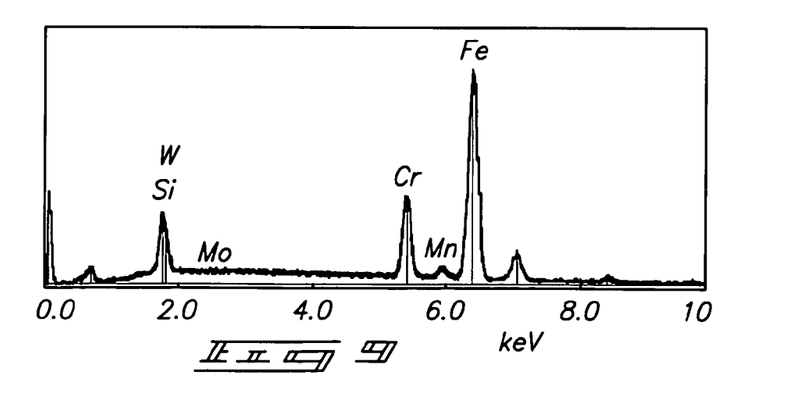
FIG. 9 shows an EDS scan taken at the surface of a heat treated coating which was formed by pulsed laser deposition from a target comprising the composition $(Fe_{0.8}Cr_{0.2})_{73}Mo_2W_2B_{16}C_4Si_1Mn_2$.

The surface of the heat treated layer 14 was observed utilizing SEM to determine uniformity of the coating as shown in FIG. 8. The majority of the structure appears uniform on a 200 nm length scale with some larger particles and particle boundaries apparent. An EDS scan shown in FIG. 9 was taken at the surface of the heat treated layer 14. The EDS scan positively identified Fe, Cr, W and Si with minor peaks present at the Mo and Mn positions.

The data obtained for the as-formed and devitrified coatings indicate the ability of the compositions to form metallic glass upon ablation deposition and to form nanocrystalline microstructure upon devitrification.

Coatings formed by methodology of the present invention can be utilized for protecting surfaces comprising silicon, for protecting non-silicon surfaces comprised by a silicon-containing structure, can be utilized for providing support and/or mechanical strength to silicon comprising devices and can impart wear resistance to silicon comprising structures. Although the coatings of the invention are described as being useful with respect to silicon surfaces and materials, the coatings can be useful for protecting other semiconductor surfaces including those in GaAs based semiconductors as well. Exemplary technologies to which the methods and coatings of the invention may be especially useful include, but are not limited to, semiconductor devices, microelectromechanical systems, and integrated micromechanical systems-on-a-chip. Additionally, use of the materials of the invention is not limited to coatings since these materials can be used to form structural features in any of these devices as well.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a metallic material on a silicon-comprising substrate comprising:
   providing a semiconductor substrate having a silicon-comprising surface;
   forming a layer comprising metallic glass over the silicon-comprising surface, the metallic glass comprising an Fe-based alloy containing at least one of P, C, B, and Si, the alloy having a total elemental composition consisting essentially of fewer than eleven elements; and
   converting the metallic glass into a hardened layer relative to the metallic glass, the hardened layer comprising a nanocomposite microstructure having a grain size of from about 75 nm to about 125 nm.

2. The method of claim 1 wherein the layer comprises an initial hardness of at least about 9.2 GPa prior to the converting and wherein the hardened layer has an increased hardness relative to the initial hardness.

3. The method of claim 1 wherein the silicon-comprising surface comprises silicon oxide.

4. The method of claim 1 wherein the silicon-comprising surface comprises silicon dioxide.

5. The method of claim 1 wherein the silicon-comprising surface comprises monocrystalline silicon.

6. The method of claim 1 wherein the Fe-based alloy contains at least 55% Fe, by weight.

7. A method of metallizing a surface comprising:
   providing a semiconductor substrate having a surface, at least part of the surface comprising silicon;
   depositing a metallic material over at least a portion of the surface, the metallic material comprising Fe and at least one member of the group consisting of B, Si, P and C; and
   wherein the metallic material comprises metallic glass after the depositing, and further comprising converting at least a portion of the metallic glass to a crystalline material having a nanocrystalline grain size of from about 75 nm to about 125 nm.

8. The method of claim 7 wherein the metallic material comprises B, Si and C.

9. A method of protecting a silicon-comprising substrate comprising:
   providing a semiconductor substrate comprising silicon within a deposition chamber;
   providing a deposition target comprising an Fe-based alloy, within the deposition chamber;
   depositing material from the deposition target over at least a portion of the semiconductor substrate to form a layer comprising metallic glass; and
   converting at least some of the metallic glass to a crystalline material having a nanocrystalline grain size of from about 75 nm to about 125 nm.

10. The method of claim 9 wherein the deposition chamber is a laser deposition chamber and wherein the depositing comprises laser deposition.

11. The method of claim 9 wherein the depositing occurs at a rate of about 10 Å per second.

12. The method of claim 9 wherein the layer comprises a thickness of from about 10 Å to about 3 μm.

13. The method of claim 12 wherein the layer comprises a thickness of from about 0.5 μm to about 1.5 μm.

14. The method of claim 9 wherein the semiconductor substrate is patterned prior to the providing the silicon-comprising substrate.

15. The method of claim 9 wherein the deposition target comprises a composition selected form the group consisting of $Fe_{63}Mo_2Si_1$, $Fe_{63}Cr_8Mo_2$, $Fe_{63}Mo_2Al_4$, $(Fe_{0.8}Cr_{0.2})_{81}B_{17}W_2$, $(Fe_{0.8}Mo_{0.2})_{83}B_{17}$, $Fe_{63}B_{17}Si_1$, $Fe_{63}Cr_8Mo_2C_5$, $Fe_{63}Mo_2C_5$, $Fe_{80}Mo_{20}$, $Fe_{63}Cr_8Mo_2B_{17}$, $Fe_{83}B_{17}$, $Fe_{63}B_{17}Si_5$, $Fe_{63}B_{17}C_2$, $Fe_{63}B_{17}C_3Si_3$, $(Fe_{0.8}Cr_{0.2})_{79}B_{17}W_2C_2$, $Fe_{63}B_{17}C_3Si_5$, $Fe_{63}B_{17}C_2W_2$, $Fe_{63}B_{17}C_8$, $Fe_{63}B_{17}C_5$, $(Fe_{0.8}Cr_{0.2})_{78}Mo_2W_2B_{12}C_5Si_1$, $Fe_{63}B_{17}C_5W_5$, $Fe_{63}B_{17}C_5Si_5$, $(Fe_{0.8}Cr_{0.2})_{76}Mo_2W_2B_{14}C_5Si_1$, $(Fe_{0.8}Cr_{0.2})_{73}Mo_2W_2B_{16}C_4Si_1Mn_2$, $Fe_{63}Cr_8Mo_2B_{17}C_5$, $(Fe_{0.8}Cr_{0.2})_{75}Mo_2B_{17}C_5Si_1$, $Fe_{63}Cr_8Mo_2B_{17}C_5Si_1Al_4$, $(Fe_{0.8}Cr_{0.2})_{75}W_2B_{17}C_5Si_1$, $Fe_{63}B_{17}C_5Si_1$, $(Fe_{0.8}Cr_{0.2})_{73}Mo_2W_2B_{17}C_5Si_1$, $(Fe_{0.8}Cr_{0.2})_{72}Mo_2W_2B_{17}C_5Si_1Gd_1$, $(Fe_{0.8}Cr_{0.2})_{71}Mo_2W_2B_{17}C_5Si_1Gd_2$, and $(Fe_{0.8}Cr_{0.2})_{74}Mo_2W_2B_{17}C_4Si_1$.

16. The method of claim 9 wherein the converting comprises heating at least a portion of the layer to a temperature of about 700° C.

* * * * *